United States Patent [19]

Slaughter

[11] Patent Number: 4,943,739
[45] Date of Patent: Jul. 24, 1990

[54] NON-REFLECTING TRANSMISSION LINE TERMINATION

[76] Inventor: Grimes G. Slaughter, 240 N. Purdue Ave., Apt. 211, Oak Ridge, Tenn. 37830

[21] Appl. No.: 286,622

[22] Filed: Dec. 19, 1988

[51] Int. Cl.⁵ .................. H03K 17/16; H03K 3/01; H01P 1/22; H01P 1/26
[52] U.S. Cl. ......................... 307/443; 307/540; 307/542; 307/555; 307/572; 333/22 R
[58] Field of Search ............... 307/443, 540, 542, 551, 307/555, 557, 558, 559, 561, 572, 473, 270; 333/22 R

[56] References Cited

U.S. PATENT DOCUMENTS

| | | | |
|---|---|---|---|
| 3,283,259 | 11/1966 | Banks | 307/559 |
| 3,344,284 | 9/1967 | Thompson | 307/542 |
| 3,727,072 | 4/1973 | Madrazo et al. | 307/443 |
| 4,015,147 | 3/1977 | Davidson et al. | 333/22 R |
| 4,220,876 | 9/1980 | Ray | 307/559 |
| 4,609,839 | 9/1986 | Howell | 307/542 |
| 4,626,715 | 12/1986 | Ishii | 307/542 |
| 4,675,551 | 6/1987 | Stevenson et al. | 307/443 |
| 4,766,334 | 8/1988 | Warner | 307/443 |

Primary Examiner—Stanley D. Miller
Assistant Examiner—Trong Quang Phan
Attorney, Agent, or Firm—Cushman, Darby & Cushman

[57] ABSTRACT

A digital signal reflection attenuation device is connected to a receiving end of a transmission line and contains a reflection attenuator connected between the signal line and the ground line, and also the signal line and the supply line. The attenuator clamps the voltage of digital signals between ground potential and the supply line voltage. Thus, even with a characteristic impedance mismatch between the transmission line and the receiver, accurate digital signals can be transmitted to the receiver.

18 Claims, 4 Drawing Sheets

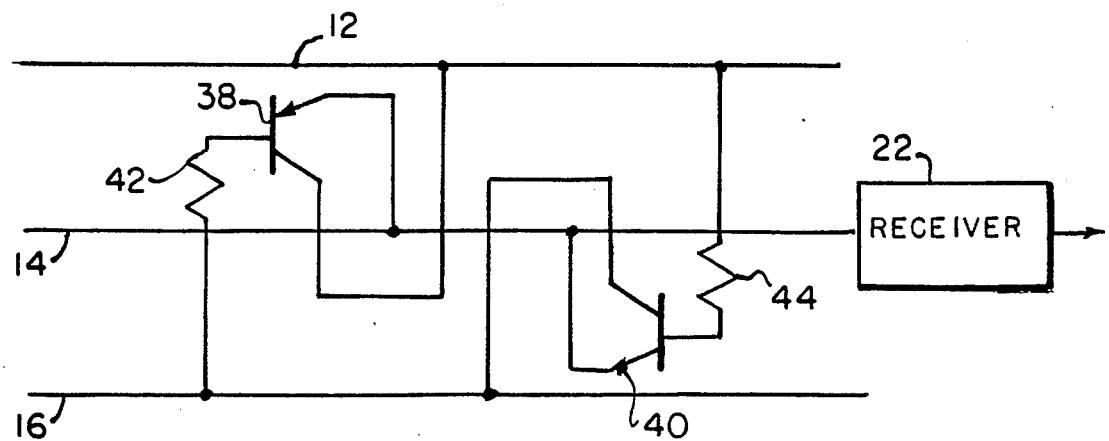
F I G. 6
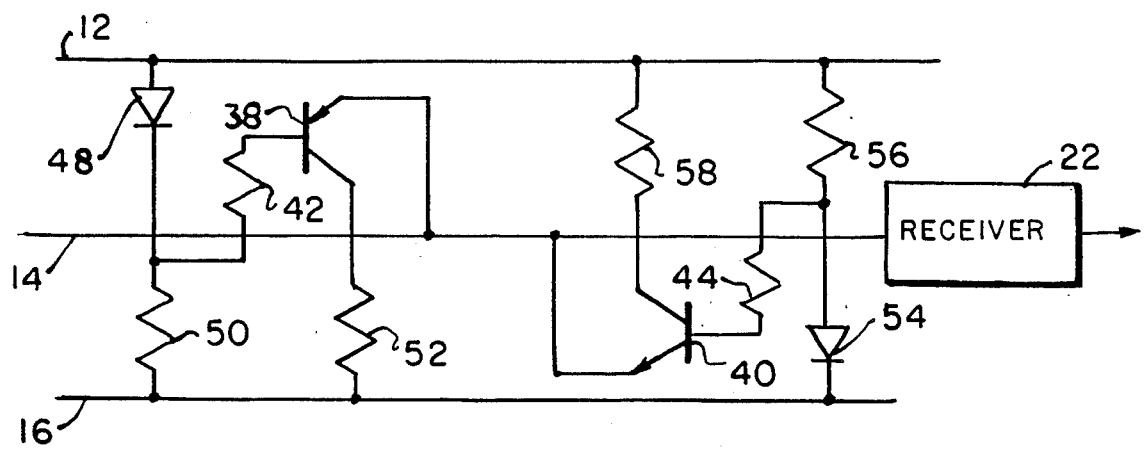
F I G. 7

NON-REFLECTING TRANSMISSION LINE TERMINATION

BACKGROUND OF THE INVENTION

1. Field of the Art.

This invention relates to a digital signal reflection attenuation device for digital transmissions and, more particularly, to a reflection attenuation device for digital transmission lines that carry digital signals, such as time division multiplex (TDM) signals.

2. Background of the Prior Art.

Transmission of digital signals, such as 350 kHz TDM signals, requires placing the signal on a transmission line with a line driver and then receiving this signal at the other end of the transmission line with a receiver. The received signal must accurately reproduce the originally transmitted signal, or else the informational content of the signal will be lost.

The prior art, to ensure the accurate reception of the transmitted signal by the receiver, painstakingly makes sure that the characteristic impedance Zo of the receiver matches the characteristic impedance (generally resistive) of the transmission line. With a proper match, reflections do not occur and the received signal can be accurately reproduced.

However, matching the characteristic impedance of the transmission line at the receiver is costly in terms of power consumption. If the line is not matched, reflections occur and signals on transmission lines becomes distorted. This distortion is due to the superposition of reflected signals and transmitted signals. The signal will be reflected in phase if the end impedance is greater than Zo, and the signals will be reflected in reverse phase if the end impedance is less than Zo. At the transmitter end the line is essentially pinned to a.c. ground through the low driver impedance, so reflections are reversed at the transmitter. As multiple reflections occur at both the driver and the receiver, the distortion increases tremendously. In effect, the transmission line acts as a voltage multiplier in that non-sinusoidal driving functions are converted to sine waves. For properly terminated transmission lines, rounding of waveforms is caused by frequency dispersion: in general, the propagation velocity is less for the higher frequencies.

An example of a worst case match of characteristic impedance is the termination of a transmission line in an open circuit. For a 100 foot flat ribbon cable transmission line having a ground line, a signal line, and a 5 Volt supply line, a series of 350 kHz, 5 Volt, square wave pulses transmitted along the signal line will result in a signal at the terminal end that is sinusoidal and can have peak to peak voltages of 70 Volts. The difference in the transmitted and received signals is graphically illustrated in FIGS. 1A and 1B.

Furthermore, although many different types of transmission lines are known, such as optical fibers and coaxial cables, these types of transmission lines are very expensive. Thus, many applications that could benefit from digital communications are not even considered because of their expense. For example, the cost of installing optical fibers or coaxial cables in a house would be prohibitive. Also, the instability of the characteristic impedance in a twisted wire pair makes its use as a longer length transmission line difficult.

Another problem with past digital transmissions lines is that they have required line drivers having a large power handling capacity, due to the resistive terminations at the receiving nodes of the transmission line. This resistive termination has, in the past, been necessary to match the characteristic impedance of each receiver and the transmission line. As the number of receivers attached to a transmission line increases, the resistance of each receiver acts as a separate load on the driver, thereby requiring line drivers having large power handling capacity, especially as the number of taps on the transmission line is increased. The parallel resistive terminators and the series line resistance act as ladder attenuators, which can greatly reduce both the a.c. and d.c. levels down the line. In turn, this reduces the signal to noise (S/N) ratio of the transmitted signal and requires the use of more expensive digital receivers so that the received signals can be accurately reproduced.

Thus, an inexpensive transmission line that does not suffer from unattenuated reflections and allows use of a driver having a smaller power handling capacity is necessary. More generally, a way of attenuating line reflections for any type of transmission line is needed.

SUMMARY OF THE INVENTION

An object of the present invention is to provide a transmission line that will minimally distort digital communication signals, have a large S/N ratio, and provide essentially lossless transmission of digital communication signals.

A further object of the invention is to provide a reflection attenuation device between a signal line and a ground line or supply line of a transmission line that clamps the voltage of digital signals between predetermined potential values to obtain minimal distortion of digital signals by attenuating any reflections.

Another object of the invention is to provide a reflection attenuation device that allows the use of a driver having a small power handling capacity which can still provide transmission of digital signals with minimal distortion to multiple taps.

It is still a further object of the invention to use a flat ribbon cable with a plurality of reflection attenuation devices disposed between each of a plurality of signal lines and ground and supply lines to prevent distortion of communication signals by attenuating any reflections.

In order to attain these objectives, and others, the present invention connects a digital signal line to a ground and supply line using reflection attenuation devices. These connections are most effective at the terminal end of the signal line, close to the receiver connection. The reflection attenuation device will then electrically connect the communication signal line to the ground or supply line when the digital signal voltage deviates outside the ground to supply potential difference.

The receiver, which is connected to the transmission line, therefore can receive accurately transmitted digital signals. The reflection attenuation device, in order to attenuate reflections, must have a low forward voltage drop, a low forward impedance, a high back impedance, and a response bandwidth adequate for the frequencies involved in the communication signal.

In one embodiment of the present invention, each reflection attenuation device is a diode connected between the ground line and the signal line and between the supply line and the signal line. In operation, the diodes clamp the signal line to the values of ground potential and the supply voltage, with deviations outside of this potential difference of only the forward voltage drop of the diode.

In other embodiments of the present invention, each reflection attenuation device is an active clamp or transistor.

A further embodiment of the present invention uses a flat ribbon cable having multiple signal lines. Each signal line is then connected to the ground line and the supply line with a reflection attenuation device. A specific implementation of this embodiment uses a 400–500 Ohm flat ribbon cable.

In another embodiment of the present invention, each tap from the signal line contains reflection attenuation devices connected between the tap signal line and the tap ground line and tap supply line.

With these embodiments, a transmission line is obtained that, even with no resistive terminators, can transmit accurate digital signals using a low power handling capacity driver.

BRIEF DESCRIPTION OF THE DRAWINGS

Other improvements, advantages and features of the present invention will become more fully apparent from the following detailed description of the preferred embodiment, and the accompanying drawings in which:

FIG. 6 illustrates a second embodiment of the present invention;

FIG. 7 illustrates a modification of the second embodiment of the present invention;

DETAILED DESCRIPTION OF THE PREFERRED EMBODIMENT

Figure 1:
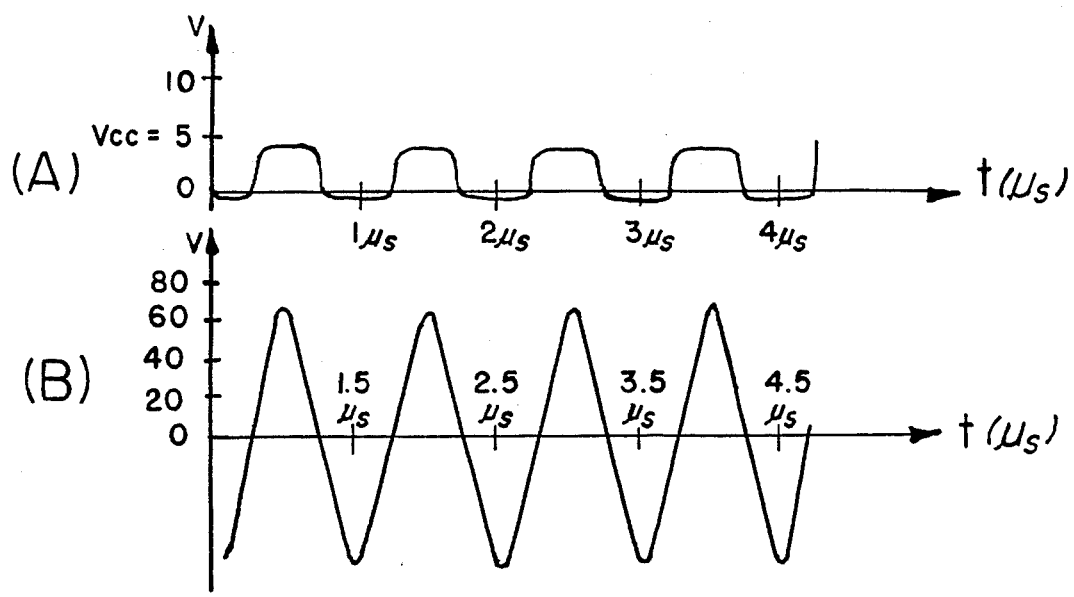
FIGS. 1A and 1B graphically illustrate a transmitted digital signal and received digitial signal, respectively, on a 100′ parallel conductor transmission line that does not employ the present invention.
Figure 2:
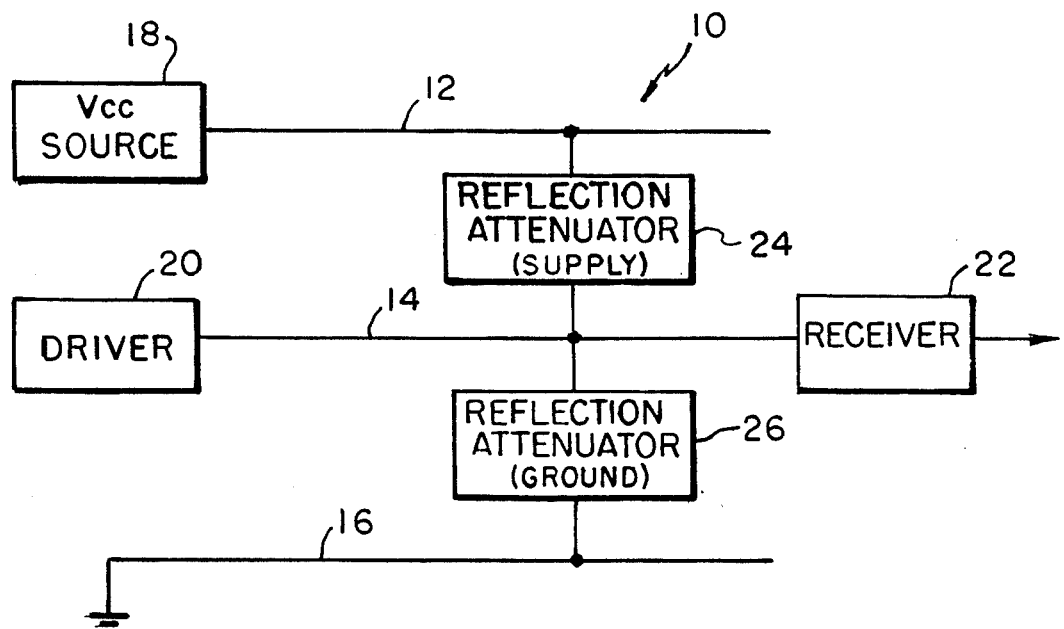
FIG. 2 illustrates a block diagram of the present invention.

FIG. 2 illustrates a transmission line 10 according to the present invention, containing supply line 12, signal line 14, and ground line 16. Supply line 12 is connected at one end to supply source 18 so that the supply voltage of supply line 12 is maintained at a predetermined value, such as 5 positive Volts. Signal line 14 is connected at a transmitting end to driver 20, which supplies digital signals to signal line 14, and, at a receiving or terminal end to a receiver 22. Receiver 22 can be any well known digital signal receiver.

Connected between supply line 12 and signal line 14 is supply reflection attenuator 24 and connected between signal line 14 and ground line 16 is ground reflection attenuator 26. Both supply reflection attenuator 24 and ground reflection attenuator 26 have a low forward voltage drop, a low forward impedance, a high back impedance, and a response bandwidth adequate for the frequencies involved in the desired communication.

Figure 3:
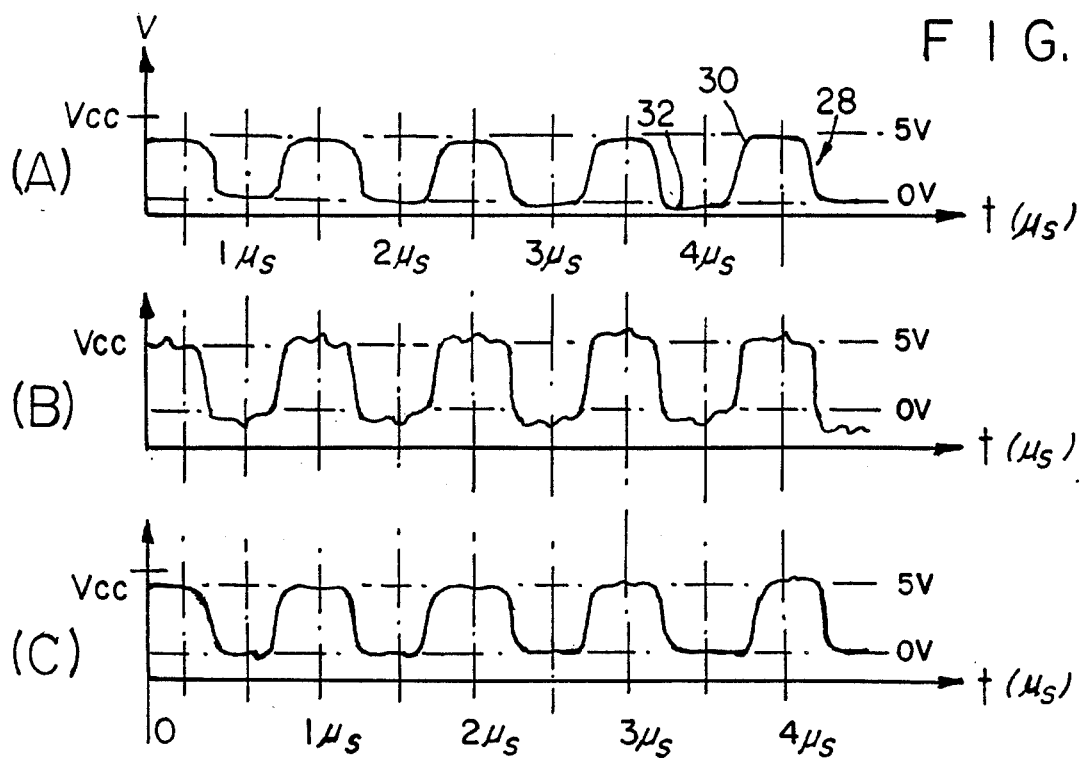
FIGS. 3A graphically illustrates a digital signal transmitted on a 100′ parallel conductor transmission line incorporating the present invention.
FIG. 3B graphically illustrates a received digital signal on a 100′ parallel conductor transmission line incorporating the embodiment shown in FIG. 4 and using silicon diodes.
FIG. 3C graphically illustrates a received digital signal on a 100′ parallel conductor transmission line incorporating the embodiment shown in FIG. 7, which produces the fastest and cleanest receiving end waveform.

Both supply reflection attenuator 24 and ground reflection attenuator 26 are connected so that the transmitted digital signal 28, as shown in FIG. 3A, does not exceed the (positive) supply voltage of supply line 12 or fall below ground potential of ground line 16 by more than the forward drop of the reflection attenuator. Thus, (positive) supply reflection attenuator 24 is forward biased if the signal line 14 assumes a higher positive potential than supply line 12, and ground reflection attenuator 26 is forward biased if the signal line 14 assumes a lower negative potential than ground line 16. The success of the invention is predicated upon digital signals of rail-to-rail amplitude, and having rail-to-rail power supply voltages of the same magnitude (or nearly so) available at all transmitters and receivers.

Also important is that both supply reflection attenuator 24 and ground reflection attenuator 26 are connected close to the receiving end of transmission line 10. When positioned in this manner, reflected digital signals will be attenuated more completely.

By clamping the voltage of transmitted digital signal 28 to ground potential and the supply voltage, the reflected digital signals are attenuated so as not to cause distortion of transmitted digital signal 28. It should be noted that the clamping by both supply reflection attenuator 24 and ground reflection attenuator 26 does not constitute clipping of a valid signal waveform. Rather, the clamping prevents the buildup of a spurious waveform.

Also, ground line 16 must have a low value high frequency impedance to ground from the non-signal ends of the reflection attenuatore 26, which may require bypass capacitors (not illustrated).

Thus, the present invention can be implemented for any transmitted digital signal 28 having a high state 30, illustrated in FIG. 3A, at or very near the supply voltage and a low state 32, also illustrated in FIG. 3A, at or very near the ground potential. It will be appreciated that, depending on the polarity of the supply voltage, the present invention can be implemented to keep the transmitted rail-to-rail digital signal 28 between any range of potential values.

Also important for recognition of the transmitted digital signal 28 is the response time between high state 30 and low state 32, and also low state 32 and high state 30. For a perfect square wave, dv/dt will be infinite and the response time zero. Although this is not practically possible for either the transmitted digital signal shown in FIG. 3A or the receiving digital signal shown in FIG. 3B, the dv/dt response time is very short using the present invention and not substantially increased at the receiving end, as a comparison of FIGS. 3A and 3B illustrate.

Figure 4:
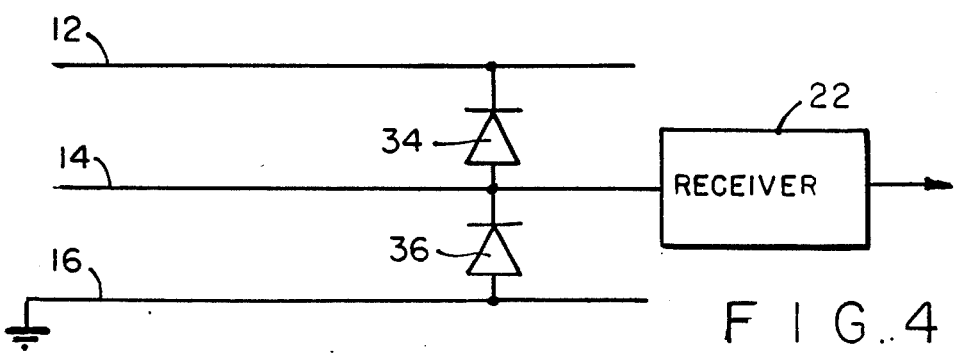
FIG. 4 illustrates a first embodiment of the present invention.

Specifically, FIGS. 3A and 3B show the transmitted digital signal and the received digital signal for the reflection attenuation termination arrangement illustrated in FIG. 4 using silicon diodes.

FIG. 4 illustrates a specific implementation of supply reflection diode 34 and ground reflection diode 36, shown in FIG. 2 as supply attenuator 24 and ground attenuator 26, respectively. Supply diode 34 connects signal line 14 and supply line 12 to clamp transmitted digital signal 28 within a forward voltage drop of supply diode 34. Similarly, ground diode 36 connects signal line 14 and ground line 16 to clamp transmitted digital signal 28 within a forward voltage drop of ground diode 36. If supply diode 34 and ground diode 36 are silicon diodes, this forward voltage drop will typically be 650 milliVolts. An advantage of using silicon diodes is that they can be integrated onto a silicon chip.

The use of silicon diodes for supply diode 34 and ground diode 36 will, however, cause ripples, as illustrated in FIG. 3B, a smaller dv/dt, and therefore, a longer response time between high state 30 and low state 32, and vice-versa. Ripples can be significantly reduced if supply diode 34 and ground diode 36 are germanium diodes, which have a forward drop of about 200 milliVolts. PIN diodes or hot carrier diodes or any other unilaterally conducting passive or active device can be substituted for the silicon or germanium diodes.

Figure 5:
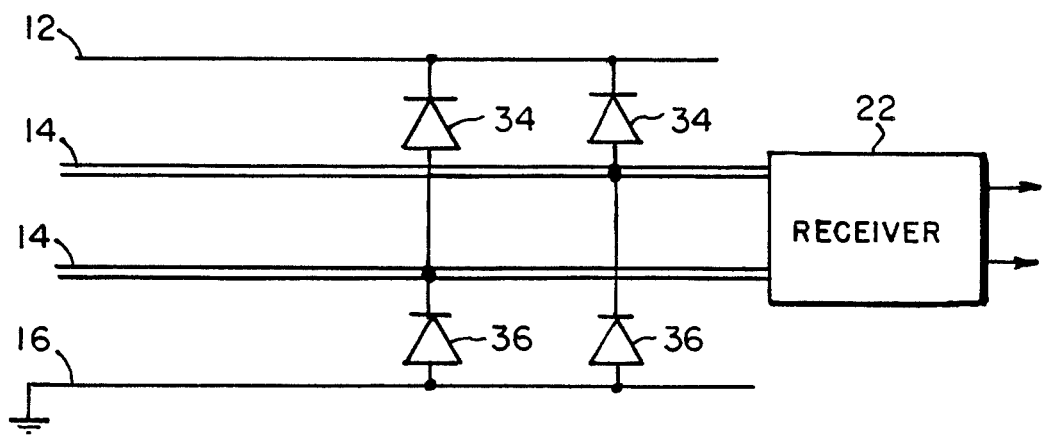
FIG. 5 illustrates a modification of the first embodiment of the present invention.

FIG. 5 illustrates a modification of the above embodiment in which two signal lines 14 are used rather than the single signal line 14 shown in FIG. 4. The number of signal lines 14 can be varied as necessary, as long as the reflection attenuators, such as each supply diode 34 and ground diode 36, are properly connected, as shown in FIG. 5. Also illustrated is the use of a differential pair for each signal line 14. With a differential pair, driver 14 can emit a differential signal and much of the common mode noise can be eliminated. Although FIG. 5 illustrates these modifications with respect to supply diodes 34 and ground diodes 36, these modifications can be used with any of the other embodiments of the present invention.

FIG. 6 illustrates another embodiment of the present invention, in which both supply reflection attenuator 24 and ground reflection attenuator 26 are transistors.

FIG. 6 illustrates the use of bipolar junction transistors, in which supply reflection attenuator 24 (in FIG. 2) is a supply transistor 38 that utilizes a PNP transistor and ground reflection attenuator 26 (in FIG. 2) is a ground transistor 40 that utilizes an NPN transistor. Connected between the base of supply transistor 38 and ground line 16 is a supply base resistor 42. The emitter is connected to signal line 14 and the collector is connected to supply line 12. Connected in a similar manner between the base of ground transistor 40 and supply line 12 is a ground base resistor 44. Both supply base resistor 42 and ground base resistor 44 have a value of 10 kOhms.

In operation, for example when the signal voltage exceeds the supply voltage, supply transistor 38 is already saturated because supply base resistor 42 is connected to ground line 16. The voltage drop across the emitter to the collector of supply transistor 38 can be as low as 100 milliVolts and the signal voltage can be kept to within 100 milliVolts of the supply voltage. Ground transistor 40 and ground base resistor 44 operate similarly.

With the embodiment shown in FIG. 6, ripples and other glitches still occur. Therefore, to eliminate these ripples and glitches as much as possible, the embodiment shown in FIG. 7 also uses a supply bias diode 48 and supply bias diode resistor 50 connected in series between supply line 12 and ground line 16, a similar supply base resistor 42 connected between supply bias diode 48 and supply bias resistor 50, and a supply collector resistor 52 connected between the collector of supply transistor 38 and ground line 16. The connections of ground bias diode 54, ground bias diode resistor 56, ground base resistor 44, and ground collector resistor 58 to ground transistor 40 mirror this connection.

With this modification, a forward diode voltage drop will always exist across supply bias diode 48. Thus, this forward voltage drop across diode 48 will bias the emitter-base junction of transistor 38 through supply base resistor 42 to the point of conduction. When the signal voltage exceeds the supply voltage clamping will occur within the matching of the forward drops of diode 48 and the emitter-base junction diode of transistor, which is usually 10 to 30 milliVolts. Supply base resistor 42 and supply collector resistor 52 are present only for purposes of current limiting. A similar argument holds for the ground bias diode 54, ground bias diode resistor 56, ground base resistor 44, and ground collector resistor 58 to ground transistor 40. This embodiment results in the fastest response time between the high state and low state, and the smallest ripples. The received digital signal using this embodiment is illustrated in FIG. 3C.

Figure 8:
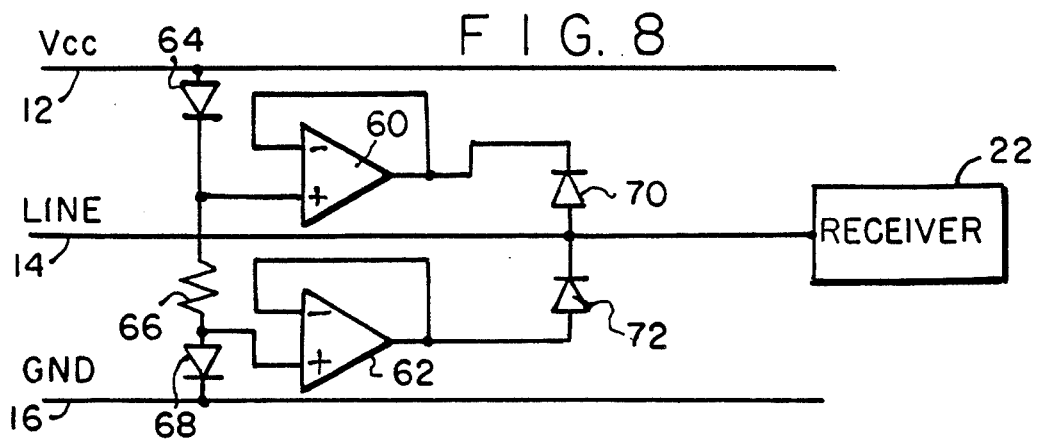
FIG. 8 illustrates a third embodiment of the present invention.

FIG. 8 illustrates another embodiment of the present invention that uses active clamps, rather than passive diode clamps as illustrated in FIGS. 4 and 5, which also act as reflection attenuators. It was found that clamping to the supply voltage was more effective than clamping to ground potential.

In FIG. 8, first bias diode 64, 10 kOhm bias resistor 66 and second bias diode 68 bias the non-inverting inputs of supply op amp 60 and ground op amp 62 to one diode drop below and one diode drop above the positive supply voltage and ground, respectively. The output of both supply op amp 60 and ground op amp 62 are connected to the respective inverting input. Connected between signal line 14 and supply op amp 60 and ground op amp 62 are supply diode 70 and ground diode 72, respectively. Supply diode 70 and ground diode 72 are then essentially servoed to one forward diode drop from their respective supply potentials. Any further deviation of the transmission line from the supply potentials should then be clamped to within a few milliVolts of the respective supply potential.

Figure 9:
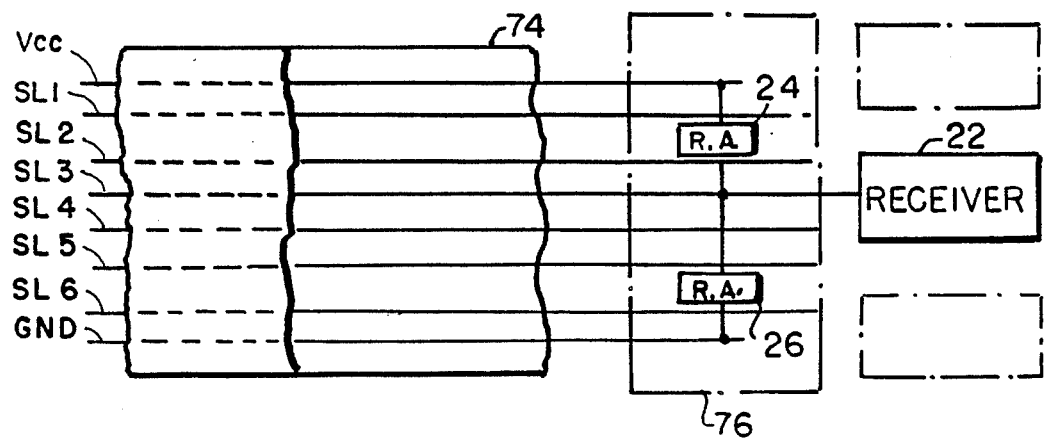
FIG. 9 illustrates an implementation of the present invention in a flat ribbon cable.

FIG. 9 illustrates an implementation of the present invention using flat ribbon cable 74 as transmission line 10 shown in FIG. 2. Flat ribbon cable 74, as shown, contains 8 conductors, each made of No. 28 wire, with centers of each conductor spaced at 0.1 inches. The number of conductors can be varied as necessary for the particular application. Because flat ribbon cable 74 has a rather high characteristic impedance, preferably between 400 and 500 Ohms, the spacings that exist between individual wires allow for easy connections.

Also shown in FIG. 9 is that supply reflection attenuators 24 and ground reflection attenuators 26 are all made on one integrated circuit chip 76 for easy connection.

Figure 10:
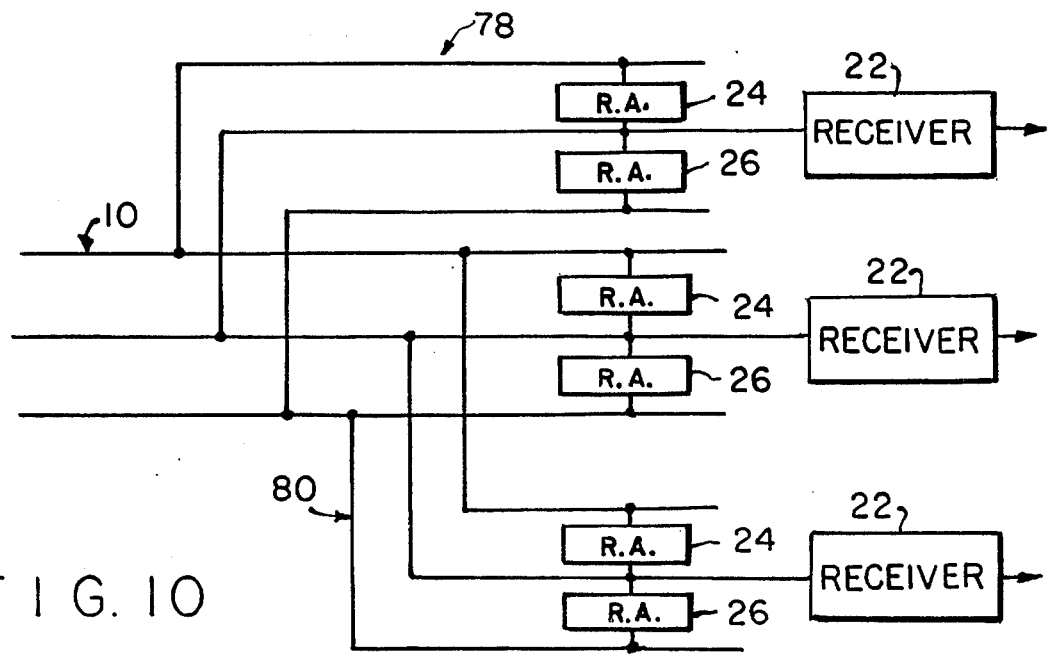
FIG. 10 illustrates the use of the present invention in a transmission line containing two taps.

Using the reflection attenuator previously described, it is possible to have many more taps on a transmission line 10. As illustrated in FIG. 10, transmission line 10 contains tap 78 and tap 80, each capable of transmitting the transmitted digital signal 28 to a separate receiver 22. Many more taps than previously are possible because the reflection attenuator of the present invention is not resistive. Therefore, many more taps can be added, in contrast to the prior art. With the reflection attenuators the total line capacity, proportional to line length, essentially determines when the driver peak current rating is reached. FIG. 10 only illustrates the use of two taps, but, depending on the length of the tap line, the driver current peak rating, and the characteristics of the transmission line, a much greater number of taps, such as 100, can easily be implemented.

Since the termination scheme using the reflection attenuator previously described is not resistive, no signal losses occur. Thus, the digital signal of the present invention is essentially electrostatic because the digital signal has the same level at both the transmitting and receiving ends of the transmission line.

While the preferred embodiment and several alternatives have been disclosed in connection with the present invention, it should be appreciated that other embodiments may be utilized in keeping with the spirit and scope of the present invention as defined by the appended claims.

What is claimed is:

1. A transmission line that receives digital signals from a driver and transmits said digital signals to a receiver comprising:
    a signal line for carrying said digital signals adaptable to be connected at one end to said driver and at an opposite end to said receiver;
    a first line for receiving a first potential;
    a second line for receiving a second potential, said first and second potentials defining a predetermined potential range; and
    means for clamping said digital signals on said signal line to a signal voltage at or near said first potential or said second potential to substantially prevent the signal from moving outside the predetermined potential range said clamping means comprising:
        a first bipolar junction transistor having an emitter connected to said signal line and a base, through a first base resistor, connected to said ground line, and
        a second bipolar junction transistor having an emitter connected to said signal line and a base, through a second base resistor, connected to said supply line.

2. A transmission line according to claim 1 wherein: said first clamp further includes:
    a first resistor connected between said first base resistor and said ground line,
    a first diode connected at one end at the node of said first resistor and said first base resistor and at the other end to said supply line, and
    a first collector resistor connected between the collector of said first bipolar junction transistor and said ground line; and
    said second clamp further includes:
    a second resistor connected between said second base resistor and said supply line,
    a second diode connected at one end at the node of said second resistor and said second base resistor and at the other end to said ground line, and
    a second collector resistor connected between the collector of said second bipolar junction transistor and said supply line.

3. A transmission line according to claim 2 wherein said first bipolar junction transistor is a PNP bipolar junction transistor, said second bipolar junction transistor is an NPN bipolar junction transistor, said other end of said first diode is the anode of said first diode, and said other end of said second diode is the cathode of said second diode.

4. A digital signal reflection attenuator adaptable to be connected to a receiving end of a transmission line, said transmission line having a signal line for transmitting digital signals, a ground line at a ground potential, and a supply line at a supply voltage, said attenuator comprising:
    first means for attenuating voltages at said ground potential that are caused by reflection of said transmitted digital signals connected between said signal line and said ground line, said first attenuating means comprising a first bipolar junction transistor having an emitter connected to said signal line and a base, through a first base resistor, connected to said ground line; and
    second means for attenuating voltages that deviate from said supply voltage in a direction opposite said ground potential and are caused by reflection of said transmitted digital signals connected between said signal line and said supply line said second attenuating means comprising a second bipolar junction transistor having an emitter connected to said signal line and a base, through a second base resistor, connected to said supply line.

5. A digital signal reflection attenuator according to claim 4 wherein:
    said first attenuating means further includes:
    a first resistor connected between said first base resistor and said ground line,
    a first diode connected at one end at the node of said first resistor and said first base resistor and at the other end to said supply line, and
    a first collector resistor connected between the collector of said first bipolar junction transistor and said ground line; and
    said second clamp further includes:
    a second resistor connected between said second base resistor and said supply line,
    a second diode connected at one end at the node of said second resistor and said second base resistor and at the other end to said ground line, and
    a second collector resistor connected between the collector of said second bipolar junction transistor and said supply line.

6. A digital signal reflection attenuator according to claim 5 wherein said first bipolar junction transistor is a PNP bipolar junction transistor, said second bipolar junction transistor is an NPN bipolar junction transistor, said other end of said first diode is the anode of said first diode, and said other end of said second diode is the cathode of said second diode.

7. A digital reflection attenuator according to claim 4 wherein said first and second attenuating means are formed on a single integrated circuit chip.

8. A transmission line that receives a ground potential, a supply potential and digital signals having an amplitude at least equal to the difference between the ground and supply potentials, from said digital signals being produced by a plurality of drivers, and transmits said digital signals to a plurality of receivers comprising:
    a flat ribbon cable, said flat ribbon cable including:
        a plurality of signal lines for carrying said digital signals, each signal line adaptable to be connected at one end to one of said plurality of drivers and at an opposite end to one of said plurality of receivers;

a ground line substantially parallel to said signal lines and adaptable to be connected to the ground potential, and a supply line substantially parallel to said signal lines and adaptable to be connected to receive the supply potential; and means for clamping said digital signals on each of said signal lines at a signal voltage substantially at or near said ground potential or said supply voltage to substantially prevent the digital signals from moving outside a predetermined potential range defined by the ground and supply potentials.

9. A transmission line according to claim 8 wherein said clamping means includes:

first means for attenuating voltages deviating away from said ground potential outside the ground to supply potential difference, connected between each signal line and said ground line; and second means for attenuating voltages deviating away from said supply potential outside the ground to supply potential difference, connected between each signal line and said supply line.

10. A transmission line according to claim 9 wherein said first and second attenuating means are diodes, said diodes connected so that signal voltage is clamped within a forward biased diode voltage drop of said ground potential and said supply voltage.

11. A transmission line according to claim 10 wherein said diodes are silicon diodes.

12. A transmission line according to claim 10 wherein said diodes are germanium diodes.

13. A transmission line according to claim 9 wherein said first and second attenuating means each include a transistor coupled between each signal line and ground line and signal line and supply line, respectively.

14. A transmission line according to claim 13 wherein said supply potential is positive and wherein:

said first attenuating means contains a first bipolar junction transistor having an emitter connected to said signal line and a base, through a first base resistor, connected to said ground line; and said second attenuating means contains a second bipolar junction transistor having an emitter connected to said signal line and a base, through a second base resistor, connected to said supply line.

15. A transmission line according to claim 14 wherein:

said first attenuating means further includes:

a first resistor connected between said first base resistor and said ground line, a diode connected at one end at the node of said first resistor and said first base resistor and at the other end to said supply line, and a first collector resistor connected between the collector of said bipolar junction transistor and said ground line; and said second clamp further includes:

a second resistor connected between said second base resistor and said supply line, a diode connected at one end between said second resistor and said second base resistor and at the other end to said ground line, and a second collector resistor connected between the collector of said bipolar junction transistor and said supply line.

16. A transmission line according to claim 9 wherein said first attenuating means comprises a plurality of first op amps in which one of said first op amps is coupled between each signal line and ground line and said second attenuating means comprises a plurality of second op amps in which one of said second op amps is coupled between each signal line and supply line.

17. A transmission line according to claim 8 wherein said flat ribbon cable has a characteristic impedance between 400 and 500 Ohms.

18. A digital signal reflection attenuator adaptable to be connected to a receiving end of a transmission line, said transmission line having a signal line for transmitting digital signals, a ground line at a ground potential, and a supply line at a supply voltage, said attenuator comprising:

first means for attenuating voltages at said ground potential that are caused by reflection of said transmitted digital signals coupled between said signal line and said ground line, said first attenuating means comprising a first op amp having a non-inverting input, an inverting input, and an output;

second means for attenuating voltages that deviate from said supply voltage in a direction opposite said ground potential and are caused by reflection of said transmitted digital signals coupled between said signal line and said supply line, said second attenuating means comprising a second op amp having a non-inverting input, an inverting input, and an output; and means for biasing said first and second attenuating means, said biasing means comprising:

a first diode connected between said non-inverting input of said first op amp and said ground line, a second diode connected between said non-inverting input of said second op amp and said supply line, a bias resistor connected between the node of said first diode and said non-inverting input of said first op amp and the node of said second diode and said non-inverting input of said second op amp, a third diode connected between said output of said first op amp and said signal line, and a fourth diode connected between said output of said second op amp and said signal line.

* * * * *